United States Patent
Yoon et al.

(10) Patent No.: US 11,805,683 B2
(45) Date of Patent: Oct. 31, 2023

(54) DISPLAY DEVICE AND MANUFACTURING METHOD THEREOF

(71) Applicant: SAMSUNG DISPLAY CO., LTD., Yongin-si (KR)

(72) Inventors: Hyung Guen Yoon, Hwaseong-si (KR); Suk Hoon Kang, Seoul (KR); Hee Ra Kim, Suwon-si (KR); Su Ji Park, Seoul (KR); Beom-Soo Shin, Hwaseong-si (KR); Hong Yeon Lee, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/545,348

(22) Filed: Dec. 8, 2021

(65) Prior Publication Data

US 2022/0140025 A1 May 5, 2022

Related U.S. Application Data

(62) Division of application No. 16/697,559, filed on Nov. 27, 2019, now Pat. No. 11,239,294.

(30) Foreign Application Priority Data

Nov. 28, 2018 (KR) .................. 10-2018-0149531
Jun. 7, 2019 (KR) .................. 10-2019-0067281

(51) Int. Cl.
*H10K 59/122* (2023.01)
*H10K 59/38* (2023.01)
(Continued)

(52) U.S. Cl.
CPC ....... *H10K 59/122* (2023.02); *H10K 59/1201* (2023.02); *H10K 59/38* (2023.02); *H10K 71/12* (2023.02); *H10K 71/13* (2023.02)

(58) Field of Classification Search
CPC ............... H01L 27/3246; H01L 27/322; H01L 2227/323; H01L 51/0004; H01L 51/0003;
(Continued)

(56) References Cited

U.S. PATENT DOCUMENTS

| 8,130,177 B2 | 3/2012 | Nakatani et al. |
| 2008/0150434 A1* | 6/2008 | Sung .................. H01L 51/5215 257/E29.151 |

(Continued)

FOREIGN PATENT DOCUMENTS

| CN | 108470756 | 8/2018 |
| EP | 3316329 | 5/2018 |

(Continued)

OTHER PUBLICATIONS

European Search Report dated Apr. 8, 2020 issued in the corresponding European Patent Application No. 19204944.3.

*Primary Examiner* — Shahed Ahmed
*Assistant Examiner* — Vicki B. Booker
(74) *Attorney, Agent, or Firm* — F. Chau & Associates, LLC

(57) ABSTRACT

A display device including a partition wall disposed on a substrate between a first electrode and a second electrode. The partition wall has an opening. A light emitting layer is disposed in the opening. An auxiliary layer having lyophobicity is disposed between the partition wall and the second electrode.

12 Claims, 13 Drawing Sheets

(51) Int. Cl.
  *H10K 59/12* (2023.01)
  *H10K 71/12* (2023.01)
  *H10K 71/13* (2023.01)

(58) Field of Classification Search
  CPC .. H10K 59/122; H10K 59/38; H10K 59/1201; H10K 71/12; H10K 71/13
  See application file for complete search history.

(56) References Cited

U.S. PATENT DOCUMENTS

| | | | |
|---|---|---|---|
| 2011/0012198 A1* | 1/2011 | Yagi | H01L 51/0541 |
| | | | 438/161 |
| 2011/0042656 A1 | 2/2011 | Burroughes et al. | |
| 2013/0146903 A1 | 6/2013 | Ichikawa et al. | |
| 2015/0028310 A1 | 1/2015 | Dai et al. | |
| 2015/0234273 A1 | 8/2015 | Matsuura et al. | |
| 2017/0062528 A1 | 3/2017 | Aoyama et al. | |
| 2018/0123071 A1 | 5/2018 | Kim et al. | |
| 2018/0138411 A1 | 5/2018 | Hung et al. | |
| 2020/0119297 A1 | 4/2020 | Lee et al. | |
| 2020/0168678 A1 | 5/2020 | Yoon et al. | |

FOREIGN PATENT DOCUMENTS

| | | |
|---|---|---|
| GB | 2455747 | 6/2009 |
| JP | 2004-055159 | 2/2004 |
| JP | 4196410 | 12/2008 |
| JP | 2011-216250 | 10/2011 |
| KR | 10-1381353 | 3/2014 |
| WO | 2009-113239 | 7/2011 |

* cited by examiner

DISPLAY DEVICE AND MANUFACTURING METHOD THEREOF

CROSS-REFERENCE TO RELATED APPLICATIONS

This application is a Divisional Application of U.S. patent application Ser. No. 16/697,559 filed on Nov. 27, 2019, which claims priority under 35 U.S.C. § 119 to Korean Patent Application No. 10-2018-0149531, filed on Nov. 28, 2018 in the Korean Intellectual Property Office, and Korean Patent Application No. 10-2019-0067281 filed on Jun. 7, 2019 in the Korean Intellectual Property Office, the disclosures of which are incorporated by reference in their entireties herein.

1. TECHNICAL FIELD

The present disclosure relates to a display device and a manufacturing method thereof.

2. DISCUSSION OF RELATED ART

A light emitting display device includes two electrodes and a light emitting layer disposed therebetween. An electron injected from one electrode that serves as a cathode, and a hole injected from the other electrode which serves as an anode are coupled with each other in the light emitting layer to generate an exciton. The exciton emits energy to emit light.

The light emitting display device includes a plurality of pixels having a light emitting diode including a cathode, an anode, and a light emitting layer, and each pixel includes a plurality of transistors and capacitors for driving the light emitting diode.

The above information is only for enhancement of understanding of the present inventive concepts, and therefore may contain information that does not form the prior art and which is already known in the relevant art.

SUMMARY

Exemplary embodiments provide a display device and a manufacturing method thereof that may stably include a light emitting layer formed by a solution process by providing an auxiliary layer that is effectively formed while providing lyophobicity on a partition wall.

An exemplary embodiment provides a display device including a partition wall disposed on a substrate between a first electrode and a second electrode. The partition wall has an opening. A light emitting layer is disposed in the opening. An auxiliary layer having lyophobicity is disposed between the partition wall and the second electrode.

A maximum thickness of the auxiliary layer may be about 100 nm or more and about 200 nm or less.

A maximum thickness of the partition wall may be about 1 μm or more and about 1.5 μm or less.

The auxiliary layer may not overlap the opening.

The auxiliary layer may include at least one of a fluorine-based compound and a siloxane-based compound.

The fluorine-based compound may be represented by Chemical Formula 1, and the siloxane-based compound may be represented by Chemical Formula 2.

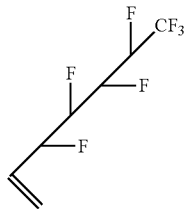

(Chemical Formula 1)

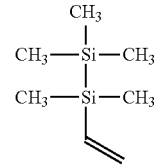

(Chemical Formula 2)

A lateral edge of the auxiliary layer is inclined and is aligned with an inclined lateral edge of the partition wall.

The auxiliary layer may expose a portion of an upper surface of the partition wall.

The auxiliary layer may overlap a lateral surface of the partition wall.

The light emitting layer may include a quantum dot.

The display device may further include a red color converting layer, a green color converting layer, and a transmissive layer that overlaps the light emission layer.

Each of the red color converting layer and the green color converting layer may include a quantum dot.

Another exemplary embodiment provides a display device including a partition wall disposed on a substrate between a first electrode and a second electrode. The partition wall has an opening. A light emitting layer is disposed in the opening. An auxiliary layer is disposed between the partition wall and the second electrode. The auxiliary layer includes a plurality of nanoparticles, and a surface of the auxiliary layer facing the second electrode is provided with protrusions and depressions.

A thickness of the auxiliary layer may be about 30 nm to about 200 nm.

The plurality of nanoparticles may include silica nanoparticles.

Another exemplary embodiment provides a manufacturing method of a display device, including forming a thin film transistor and a pixel electrode connected to the thin film transistor on a substrate. A first material layer is formed overlapping the pixel electrode on the substrate. The first material layer is etched to form a partition wall including an opening. A residual film that is formed on the pixel electrode is removed. An auxiliary layer is formed having lyophobicity on the partition wall.

The removing of the residual film may use at least one of a plasma process and a $UVO_3$ process.

The forming of the auxiliary layer may include forming a second material layer on the partition wall, and removing an uncured area in the second material layer, and the removing of the uncured area may use an organic solvent.

The organic solvent may include at least one of toluene, cyclopentanone, anisole, and propylene glycol methyl ether acetate (PGMEA).

The second material layer may include the same solvent as the organic solvent.

The manufacturing method of the display device may further include providing a light emitting solution on the opening, and drying the light emitting solution to form a light emitting layer.

Another exemplary embodiment provides a manufacturing method of a display device, including forming a thin film transistor and a pixel electrode connected to the thin film transistor on a substrate. A first material layer and a second material layer are sequentially formed overlapping the substrate on the pixel electrode. The first material layer and the second material layer are etched to form a partition wall having an opening and an auxiliary layer. A residual film formed on the pixel electrode is removed. The second material layer may include a plurality of nanoparticles.

According to exemplary embodiments of the present inventive concepts, it is possible to stably form a light emitting layer through a solution process by including an auxiliary layer that is stably formed on an upper surface of a partition wall and has lyophobicity. Reliability of a light emitting diode and a display device including such a light emitting layer may be improved.

DETAILED DESCRIPTION OF THE EXEMPLARY EMBODIMENTS

Figure 1:
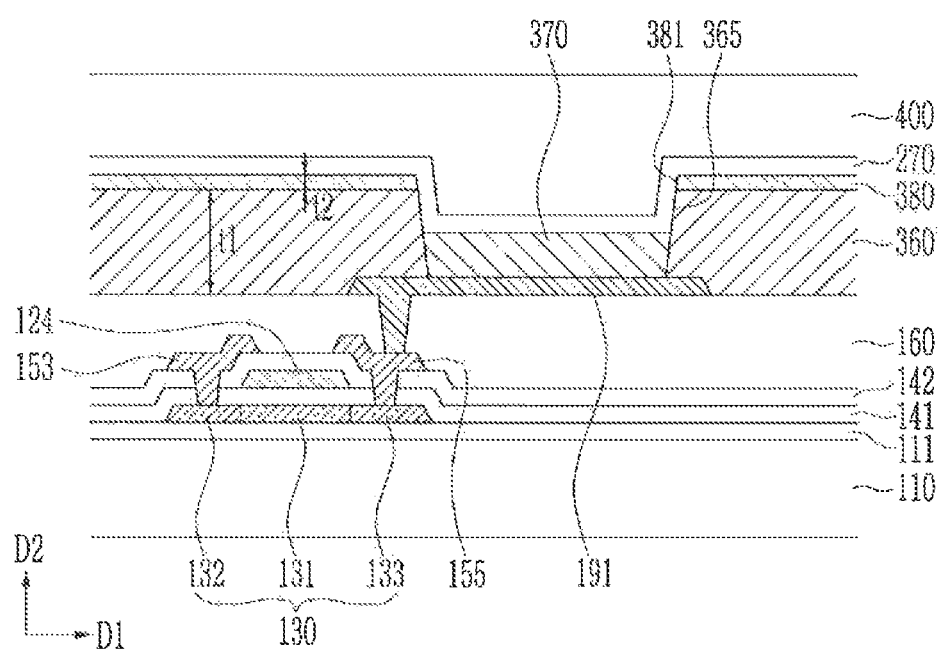
FIG. 1 illustrates a cross-sectional view of a display device according to an exemplary embodiment of the present inventive concepts.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present disclosure.

Parts that are irrelevant to the description will be omitted to clearly describe the present disclosure, and like reference numerals designate like elements throughout the specification.

Further, in the drawings, the size and thickness of each element are arbitrarily illustrated for ease of description, and the present disclosure is not necessarily limited to those illustrated in the drawings. In the drawings, the thicknesses of layers, films, panels, regions, etc., may be exaggerated for clarity. In the drawings, for ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means disposed on or below the object portion, and does not necessarily mean disposed on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, throughout the specification, the phrase "on a plane" means viewing a target portion from the top, and the phrase "on a cross-section" means viewing a cross-section formed by vertically cutting a target portion from the side.

Hereinafter, a display device according to an exemplary embodiment of the present invention will be described. FIG. 1 illustrates a cross-sectional view of a display device according to an exemplary embodiment of the present inventive concepts.

Referring to FIG. 1, a substrate 110 may include a transparent glass substrate. However, in another exemplary embodiment, the substrate 110 may include a plastic layer and a barrier layer that are alternately stacked. The substrate 110 according to an exemplary embodiment may be a flexible substrate which may be bent, folded, rolled, etc.

A buffer layer 111 is disposed on the substrate 110. The buffer layer 111 may prevent impurities or the like from diffusing from the substrate 110 toward the inside of the display device. In addition, the buffer layer 111 may improve a flatness of a surface of the substrate 110 (e.g., planarize the surface of the substrate) in embodiments in which the surface of the substrate 110 is not uniform.

The buffer layer 111 may include an inorganic insulating material such as a silicon oxide, a silicon nitride, or the like. However, in some exemplary embodiments, the buffer layer 111 may include an organic insulating material. The buffer layer 111 may be a single layer or have a multilayer structure. For example, in an exemplary embodiment in which the buffer layer 111 is a dual layer, a lower layer thereof may include a silicon nitride and an upper layer thereof may include a silicon oxide. However, exemplary embodiments of the present inventive concepts are not limited thereto.

A semiconductor layer 130 is disposed on the buffer layer 111. In an exemplary embodiment, the semiconductor layer 130 may include amorphous silicon, polycrystalline silicon, an oxide semiconductor, and the like. However, exemplary embodiments of the present inventive concepts are not limited thereto.

The semiconductor layer 130 may include a source region 132 connected to a source electrode 153, a drain region 133 connected to a drain electrode 155, and a channel region 131 disposed between the source region 132 and the drain region 133, which will be described later. The source region 132 and the drain region 133 may be doped with an impurity.

A first insulating film 141 is disposed on the semiconductor layer 130 and the buffer layer 111. For example, as shown in FIG. 1, the first insulating film 141 may be disposed directly on upper surfaces (e.g., in the second direction D2) of the semiconductor layer 130 and buffer layer 111. The first insulating film 141 may include an inorganic insulating material such as a silicon nitride, a silicon oxide, a metal oxide, or the like. However, in some exemplary embodiments, the first insulating film 141 may include an organic insulating material.

A gate electrode 124 is disposed on the first insulating film 141. For example, as shown in FIG. 1, the gate electrode 124 may be disposed directly on an upper surface (e.g., in the second direction D2) of the first insulating film 141. The gate electrode 124 overlaps (e.g., in the second direction D2) the channel region 131 of the semiconductor layer 130.

The gate electrode 124 may include at least one material selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). The gate electrode 124 may include a single layer or a multilayer structure.

A second insulating film 142 may be disposed on the gate electrode 124 and the first insulating film 141. For example, the second insulating film 142 may be disposed directly on an upper surface (e.g., in the second direction D2) of the first insulating film 141. The second insulating film 142 may include an inorganic insulating material such as a silicon nitride, a silicon oxide or the like. However, in some exemplary embodiments, the second insulating film 142 may include an organic insulating material.

The source electrode 153 and the drain electrode 155 may be disposed on the second insulating film 142. For example, as shown in FIG. 1, the source electrode 153 and the drain electrode 155 may be disposed directly on an upper surface (e.g., in the second direction D2) of the second insulating film 142.

The source electrode 153 and the gate electrode 155 may include at least one material selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). The source electrode 153 and the drain electrode 155 may include a single layer or a multilayer structure.

The source electrode 153 and the drain electrode 155 may be connected to the source region 132 and the drain region 133 of the semiconductor layer 130, respectively, through contact holes formed in the first insulating film 141 and the second insulating film 142.

A third insulating film 160 is disposed on the source electrode 153 and the drain electrode 155. The third insulating film 160 may cover the source electrode 153 and the drain electrode 155 for planarization thereof. The third insulating film 160 may include an organic insulating material or an inorganic insulating material.

The first electrode, which is a pixel electrode 191, is disposed on the third insulating film 160. For example, as shown in FIG. 1, the pixel electrode 191 may be disposed directly on an upper surface (e.g., in the second direction D2) of the third insulating film 160. The pixel electrode 191 may be connected to the drain electrode 155 through a contact hole formed in the third insulating film 160.

The pixel electrode 191 may be a transparent electrode, a transflective electrode, or a reflective electrode. In embodiments in which the pixel electrode 191 is a transparent electrode or a transflective electrode, the pixel electrode 191 may be formed of ITO, IZO, ZnO, $In_2O_3$, IGO, or AZO. In embodiments in which the pixel electrode 191 is a reflective electrode, the pixel electrode 191 may include a reflective film including Ag, Mg, Al, Pt, Pd, Au, Ni, Nd, Ir, Cr, and a compound thereof, and a layer including ITO, IZO, ZnO, $In_2O_3$, IGO, or AZO. However, exemplary embodiments of the pixel electrode 191 are not limited thereto, and the pixel electrode 191 may include various materials, and may have variously modified structures such as a single layer structure or a multi-layer structure.

A partition wall 360 is disposed on the pixel electrode 191 and the third insulating film 160. For example, as shown in FIG. 1, the partition wall 360 may be disposed directly on an upper surface (e.g., in the second direction D2) and lateral edge surfaces of the pixel electrode 191 and an upper surface of the third insulating film 160. The partition wall 360 includes an opening 365 that exposes a portion of the pixel electrode 191. A light emitting layer 370 may be disposed in the opening 365. For example, as shown in FIG. 1, the light emitting layer 370 may be disposed directly on the portion of the pixel electrode 191 exposed by the opening 365. An exposed region of the pixel electrode 191 having the light emitting layer thereon may be a light emitting region and a region in which the partition wall 360 covers the pixel electrode may be a non-light emitting region.

In an exemplary embodiment, the partition wall 360 may be lyophilic. In a process in which a light emitting solution is provided in the opening 365, the light emitting solution may be stably injected into the opening, adjacent to the lyophilic partition wall 360. The lyophilic partition wall 360 may help stably position the light emitting solution within the opening 365.

The partition wall 360 may include an organic material. For example, in an exemplary embodiment, the organic material may be benzocyclobutene, a polyamide resin, a polyacrylic resin, a polyimide resin, a phenol resin, or a siloxane-based inorganic material. However, exemplary embodiments of the present inventive concepts are not limited thereto. The partition wall 360 may additionally include at least one of an initiator, a crosslinking agent, a photoactive agent, and a surfactant. The partition wall 360 may include a photoactive agent when it includes a positive photoresist, and the partition wall 360 may include an initiator when it includes a negative photoresist.

A maximum thickness t1 of the partition wall 360 (e.g., the length from a top surface of the partition wall to a bottom surface of the partition wall in the second direction D2) may be about 1 μm to about 1.5 μm. Lateral edges of the partition wall 360 forming the opening may have a tapered shape toward the substrate 110. For example, the opening 365 may expose lateral edges of the partition wall 360 which are spaced farther apart as the distance from the substrate increases. The thickness t1 of the partition wall 360 in the flat region which does not include the inclined lateral edges of the partition wall may be about 1 μm to about 1.5 μm. In embodiments in which the thickness of the partition wall 360 is less than about 1 μm, a distinction between a light emitting region in which the light emitting layer is disposed and a non-light emitting region in which a light emitting layer is not disposed is not clear and a resolution of the display device may be lowered. In embodiments in which the thickness of the partition wall 360 is greater than about 1.5 μm, it is difficult for other components that are stacked on the partition 360 to have a uniform profile in a continuous shape.

The light emitting layer 370 is disposed on the pixel electrode 191 exposed by the opening 365 as described above. A common electrode 270 is disposed on the light emitting layer 370 and the partition wall 360. For example, as shown in FIG. 1, the common electrode 270 may be disposed directly on an upper surface (e.g., in the second direction D2) of the light emitting layer 370 and the partition wall 360.

The pixel electrode 191, the light emitting layer 370, and the common electrode 270 may form a light emitting diode. The common electrode 270 may be a transparent electrode, a transflective electrode, or a reflective electrode.

When the common electrode 270 is a transparent electrode or a transflective electrode, the common electrode 270 may include a layer including a metal having a small work function, such as Li, Ca, LiF/Ca, LiF/Al, Al, Ag, Mg, and a compound thereof, and a transparent layer such as ITO, IZO, ZnO, or $In_2O_3$, or a transflective conductive layer. When the common electrode 270 is a reflective electrode, it may include, for example, a layer including Li, Ca, LiF/Ca, LiF/Al, Al, Ag, Mg, and a compound thereof. However, the materials and the stacked structure of the common electrode 270 are not limited thereto, and exemplary embodiments of the present inventive concepts may have various modifications and arrangements.

The pixel electrode 191 is an anode that is a hole injection electrode, and the common electrode 270 is a cathode that is an electron injection electrode. However, exemplary embodiments of the present inventive concepts are not limited thereto. For example, in other exemplary embodiments, the pixel electrode 191 may be a cathode and the common electrode 270 may be an anode according to a driving method of the display device. Holes and electrons are injected into the light emitting layer 370 from the pixel electrode 191 and the common electrode 270, respectively, and exitons generated by coupling the injected holes and electrons fall from an excited state to a ground state to emit light.

In an exemplary embodiment, the light emitting layer 370 may include a low molecular organic material or a polymer organic material such as poly(3,4-ethylenedioxythiophene) (PEDOT). The light emitting layer 370 may include a multilayer structure that includes a light emitting layer and at least one of a hole injecting layer, a hole transporting layer, an electron transporting layer, and an electron injecting layer. In embodiments in which all of these layers are included, the hole injecting layer is disposed on the pixel electrode 191, which is an anode, and the hole transporting layer, the light emitting layer, the electron transporting layer, and an electron injecting layer may be sequentially stacked thereon.

The light emitting layer 370 according to the exemplary embodiment may include a quantum dot. The quantum dot may emit red light, green light, or blue light. In an exemplary embodiment, a core of the quantum dot may be selected from Group II-VI compounds, Group III-V compounds, Group IV-VI compounds, Group IV elements, Group IV compounds, and combinations thereof.

The Group II-VI compound may be selected from: a two-element compound selected from CdSe, CdTe, ZnS, ZnSe, ZnTe, ZnO, HgS, HgSe, HgTe, MgSe, MgS, and a mixture thereof; a three-element compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a four-element compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-V compound may be selected from: a two-element compound selected from GaN, GaP, GaAs, GaSb, AlN, AlP, AlAs, AlSb, InN, InP, InAs, InSb, and a mixture thereof; a three-element compound selected from GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, and a mixture thereof; and a four-element compound selected from GaAlNAs, GaAlNSb, GaAlPAs, GaAlPSb, GaInNP, GaInNAs, GaInNSb, GaInNAs, GaInPSb, InAlNP, InAlNAs, InAlNSb, InAlPAs, InAlPSb, and a mixture thereof.

The Group IV-VI compound may be selected from: a two-element compound selected from SnS, SnSe, SnTe, PbS, PbSe, PbTe, and a mixture thereof; a three-element compound selected from SnSeS, SnSeTe, SnSTe, PbSeS, PbSeTe, PbSTe, SnPbS, SnPbSe, SnPbTe, and a mixture thereof; and a four-element compound selected from SnPbSSe, SnPbSeTe, SnPbSTe, and a mixture thereof. The Group IV element may be selected from Si, Ge, and a mixture thereof. For example, the Group IV compound may be a two-element compound selected from SiC, SiGe, and a mixture thereof.

The two-element compound, the three-element compound, or the four-element compound may be present in particles of the quantum dots at uniform concentrations, or they may be divided into states having partially different concentrations to be present in the same particle, respectively. In addition, a core/shell structure in which some quantum dots enclose some other quantum dots may be possible. In an exemplary embodiment, an interface between the core and the shell may have a concentration gradient in which a concentration of elements of the shell decreases as the distance to the shell center decreases.

In some exemplary embodiments, the quantum dot may have a core-shell structure that includes a core including the nanocrystal described above and a shell surrounding the core. The shell of the quantum dot may serve as a passivation layer for maintaining a semiconductor characteristic and/or as a charging layer for applying an electrophoretic characteristic to the quantum dot by preventing chemical denaturation of the core. The shell may be a single layer or have a multilayer structure. An example of the shell of the quantum dot includes a metal or nonmetal oxide, a semiconductor compound, or a combination thereof.

For example, the metal or nonmetal oxide may be a two-element compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, and the like, or a three-element compound such as $MgAl_2O_4$, $CoFe_2O_4$, $NiFe_2O_4$, $CoMn_2O_4$, and the like. However, exemplary embodiments of the present inventive concepts are not limited thereto.

In addition, the semiconductor compound may be CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or the like. However, exemplary embodiments of the present inventive concepts are not limited thereto.

The quantum dot may have a full width at half maximum (FWHM) of the light-emitting wavelength spectrum that is equal to or less than about 45 nm. For example the quantum dot may have a FWHM equal to or less than about 40 nm. In another exemplary embodiment, the quantum dot may have a FWHM equal to or less than about 30 nm. In this range, color purity or color reproducibility of the display device may be improved. In addition, since light emitted through the quantum dot is emitted in all directions, a viewing angle of the transmitted light may be improved.

Further, a shape of the quantum dot is not particularly limited and may include a spherical, pyramidal, multi-arm, or cubic nanoparticle, nanotube, nano-wire, nano-fiber, nano-plate particle shape, and the like.

The quantum dot may control a color of emitted light according to a particle size thereof. Therefore, the quantum dot may have various light emitting colors such as blue, red, and green colors.

The light emitting layer 370 may be formed by a solution process. For example, the light emitting layer 370 may be formed by using any one of the following processes: spin coating, inkjet printing, gravure printing, roll-to-roll printing, syringe injection, dip coating, spray coating, relief printing, and screen printing.

In an exemplary embodiment, an auxiliary layer 380 is disposed between the common electrode 270 and the partition wall 360. The auxiliary layer 380 may be disposed on an upper surface of the partition wall 360. For example, as shown in FIG. 1, a lower surface (e.g., in the second direction D2) of the auxiliary layer 380 may be disposed directly on an upper surface of the partition wall 360 and an upper surface of the auxiliary layer 380 may contact a lower surface of the common electrode 270. The auxiliary layer 380 may not overlap the opening 365 of the partition wall 360 in the second direction D2. The auxiliary layer 380 may not overlap lateral edge surfaces of the partition wall 360 in the second direction D2. The auxiliary layer 380 may be generally spaced apart in the first direction D1 from the opening 365 of the partition wall. However, as described in more detail later, in an exemplary embodiment, the lower surface of the lateral edge of the auxiliary layer may substantially overlap (e.g., in the second direction D2) the upper surface of the lateral edge of the partition wall.

The auxiliary layer 380 according to an exemplary embodiment may have lyophobicity. For example, the auxiliary layer 380 may include a composition having lyophobicity. During a manufacturing process of the display device in which the light emitting layer is formed through a solution process, a light emitting solution for forming the light emitting layer 370 may contact the auxiliary layer 380. However, since the auxiliary layer 380 has lyophobicity, the light emitting solution may be forced away from the auxiliary layer 380 and may be stably positioned in the opening 365 of the lyophilic partition wall 360 rather than being positioned on the auxiliary layer. The light emitting solution may be positioned in the opening 365 without contacting the auxiliary layer 380, and particularly, it may form a stable light emitting layer 370 that does not flow over from the opening 365. Therefore, the reliability of the light emitting diode including the light emitting layer 370 and the display device may thereby be improved.

In the present specification, the lyophobicity means a property of pushing out a solution and not allowing the solution to penetrate well, and the word "lyophilic" means a property of having an affinity for a solution. For example, a solution may have a low surface bonding force with one surface having a lyophobic property and may have an excellent surface bonding force with another surface being lyophilic. Therefore, according to exemplary embodiments of the present inventive concepts, the surface bonding force between the light emitting solution and the auxiliary layer 380 may be weaker than the surface bonding force between the light emitting solution and the partition wall 360. A contact angle of the light emitting solution with respect to the auxiliary layer 380 may be, for example, about 40 degrees or more.

The auxiliary layer 380 may include a material that is lyophobic to the light emitting solution. In an exemplary embodiment, the auxiliary layer 380 may include a monomer or polymer. For example, the auxiliary layer 380 may include a fluorine-based compound or a siloxane-based compound. However, in other embodiments, the auxiliary layer 380 may include any compound having lyophobicity. The fluorine-based compound may be represented by Chemical Formula 1, and the siloxane-based compound may be represented by Chemical Formula 2. However, exemplary embodiments of the present inventive concepts are not limited thereto.

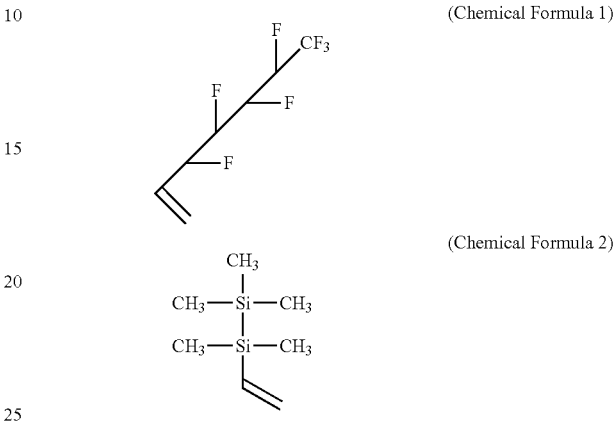

A maximum thickness t2 of the auxiliary layer 380 may be about 100 nm to about 200 nm or less. For example, the maximum thickness t2 of the auxiliary layer 380 may be between about 120 nm to about 180 nm or less. Considering that the maximum thickness t1 of the partition wall 360 is about 1 μm to about 1.5 μm, the auxiliary layer 380 is considerably thinner than the partition wall. The auxiliary layer 380 may be formed to be a thin layer for providing lyophobicity to the upper surface of the partition wall 360.

In embodiments in which the thickness of the auxiliary layer 380 is less than 100 nm, it may be difficult to substantially form a layer that has lyophobicity. In addition, the thickness of the auxiliary layer 380 may not exceed 200 nm so that the auxiliary layer 380 is sufficiently lyophobic and the light emitting solution forming the light emitting layer 370 is stably positioned on the opening 365. In embodiments, in which the thickness of the auxiliary layer 380 exceeds 200 nm, the light emitting solution injected into the opening 365 may be excessively swollen, and the light emitting solution may flow into an adjacent opening for mixture with the contents therein and may not be stably positioned in the opening.

In addition, the auxiliary layer 380 may have surface energy of about 15 dyne/cm or less, the light emitting solution for forming the light emitting layer 370 may have surface energy of about 17 to 35 dyne/cm, and the pixel electrode 191 may have surface energy of about 40 dyne/cm. The partition wall 360 may have surface energy of about 30 dyne/cm to about 43 dyne/cm. The surface energy of the partition wall 360 may be greater than the surface energies of the light emitting layer 370 and the auxiliary layer 380, and may be smaller than the surface energy of the pixel electrode 191.

The auxiliary layer 380 is disposed on the partition wall 360, and may form a separate layer from the partition wall 360. Since the auxiliary layer 380 is formed through a separate manufacturing process from that of the partition wall 360, an interface may be formed between the partition wall 360 and the auxiliary layer 380.

In addition, the lateral edge 381 of the auxiliary layer 380 may inclined so that is substantially aligned with the inclined lateral edge of the partition wall 360. The lower surface of the lateral edge 381 of the auxiliary layer 380 and the upper surface of the lateral edge of the partition wall 360 may substantially overlap (e.g., in the second direction D2). In an exemplary embodiment, the auxiliary layer 380 may be manufactured by using a same mask as a mask used for forming the partition wall 360 in a manufacturing process.

In embodiments in which the light emitting solution is provided on the substrate 110 by a solution process, such as an inkjet process, the light emitting solution is not positioned on an upper surface of the lyophobic auxiliary layer 380 and may be stably provided in the opening 365 included in the partition wall 360. The lyophobic auxiliary layer 380 prevents the light emitting solution from overflowing the partition wall 360. Therefore, the light emitting layer 370 may have improved reliability, and a light emitting diode and a display device with improved reliability may be provided.

An encapsulation layer 400 for protecting the light emitting diode may be disposed on the common electrode 270. For example, as shown in FIG. 1, the encapsulation layer 400 may be disposed directly on an upper surface (e.g., in the second direction D2) of the common electrode 270. The encapsulation layer 400 may be sealed to the substrate 110 by a sealant. The encapsulation layer 400 may be formed of various materials such as glass, quartz, ceramic, plastic, metal and combinations thereof.

In other exemplary embodiments, the encapsulation layer 400 may be disposed on the common electrode 270 without using a sealant. The encapsulation layer 400 may include a single layer of an inorganic film or a single layer of an organic film. The encapsulation layer 400 may also include a multilayer structure in which an inorganic film and an organic film are alternately stacked. For example, the encapsulation layer 400 may include two inorganic films, and an organic film disposed between the two inorganic films.

In the present specification, a pixel is a minimum unit for displaying an image. For example, in the exemplary embodiment of claim 1, the thin film transistor is disposed at each pixel in the display area and the light emitting diode is connected to the thin film transistor. However, in other exemplary embodiments, one pixel may include at least two thin film transistors and one capacitor. However, exemplary embodiments of the present inventive concepts are not limited thereto. For example, one pixel may include three or more thin film transistors and two or more capacitors.

Figure 2:
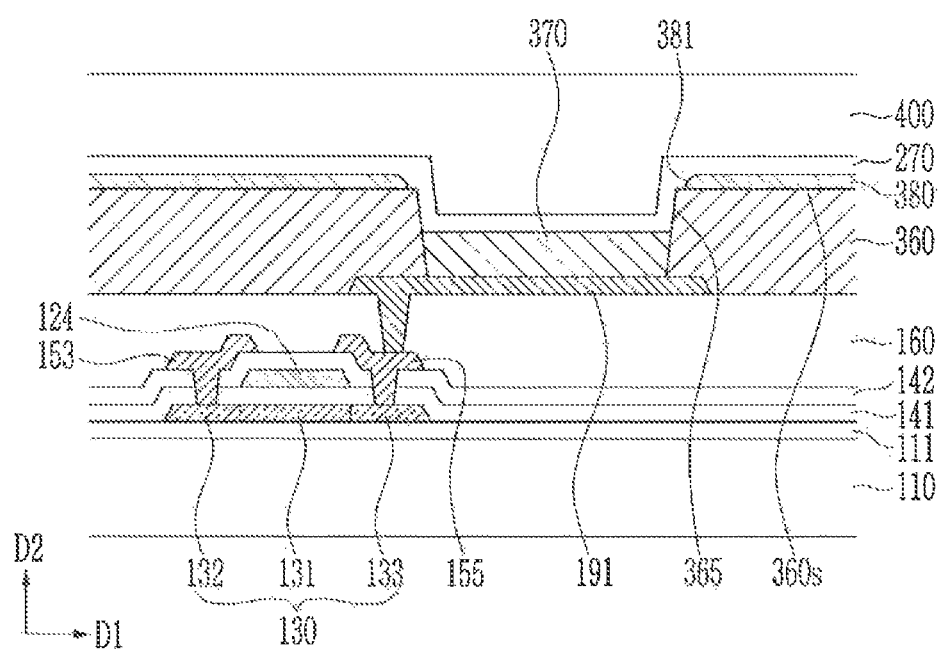
FIG. 2 illustrates a cross-sectional view of a display device according to an exemplary embodiment of the present inventive concepts.
Figure 3:
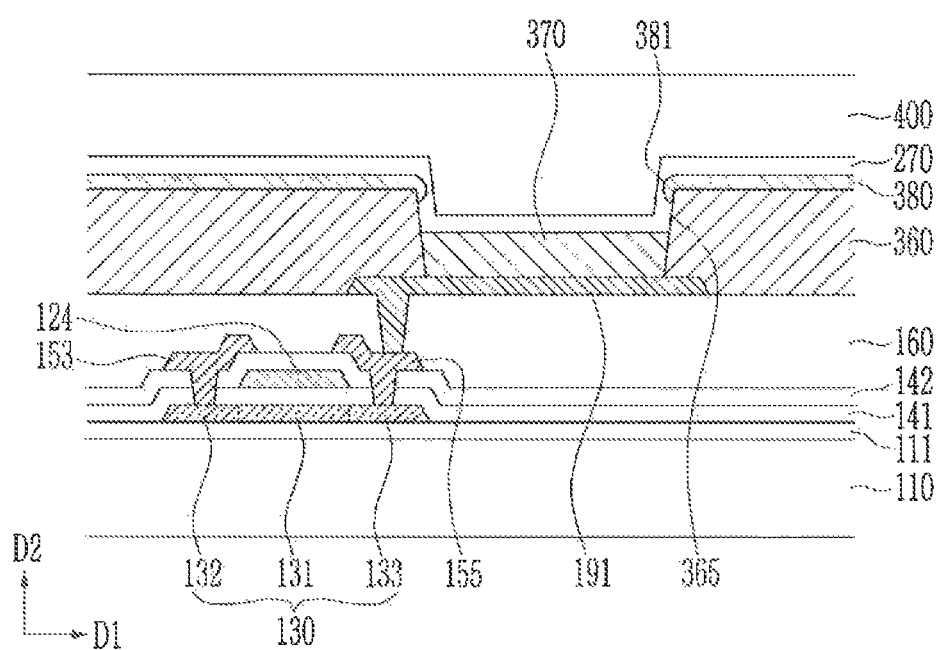
FIG. 3 illustrates a cross-sectional view of a display device according to an exemplary embodiment of the present inventive concepts.
Figure 4:
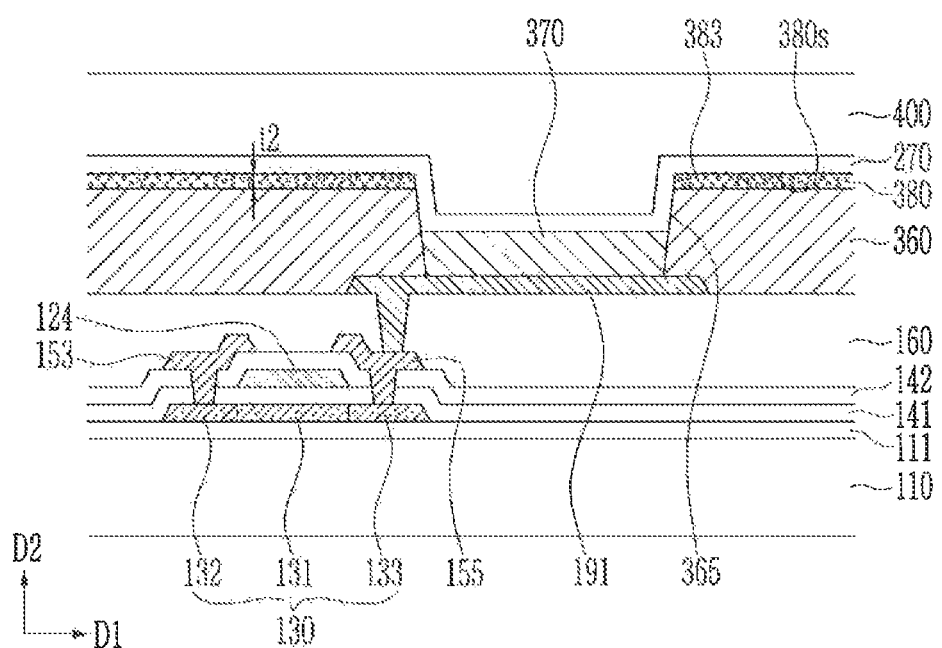
FIG. 4 illustrates a cross-sectional view of a display device according to an exemplary embodiment of the present inventive concepts.

Hereinafter, a display device according to exemplary embodiments will be described with reference to FIG. 2 to FIG. 4. FIG. 2 illustrates a cross-sectional view of a display device according to an exemplary embodiment. FIG. 3 illustrates a cross-sectional view of a display device according to an exemplary embodiment. FIG. 4 illustrates a cross-sectional view of a display device according to an exemplary embodiment. A description of the same constituent elements as those of the exemplary embodiment described above will be omitted.

Referring to the exemplary embodiment shown in FIG. 2, the auxiliary layer 380 may be disposed between the partition wall 360 and the common electrode 270. The auxiliary layer 380 may be disposed only on the upper surface of the partition wall 360, and the lower surface of the lateral edge of the auxiliary layer may not substantially overlap the upper surface of the inclined lateral edges of the partition wall 360. For example, the lateral edge 381 of the auxiliary layer 380 may terminate in the first direction D1 prior to reaching a portion that overlaps the inclined lateral edge of the partition wall in the second direction D2.

The auxiliary layer 380 may expose a portion of an upper surface 360s of the partition wall 360 from the lateral edge of the partition wall to a portion overlapping the lateral edge of the auxiliary layer in the second direction D2. In an exemplary embodiment, the common electrode 270 may overlap the portion of the upper surface 360s of the partition wall 360 exposed by the auxiliary layer 380 in the second direction D2.

Referring to the exemplary embodiment shown in FIG. 3, the upper and lower portions of the lateral edge 381 of the auxiliary layer 380 may overlap not only the upper surface of the partition wall 360, but also portions of the lateral edge below the upper surface of the partition wall 360. For example, the lateral edge 381 of the auxiliary layer may extend past the edge of the upper surface of the partition wall 360 in the first direction D1 and may overlap with the light emitting layer 370 in the second direction D2. The lateral edge 381 of the auxiliary layer may extend downward in the second direction D2 and may cover upper portions of the lateral edge of the partition wall 360. In the exemplary embodiment shown in FIG. 3, the lateral edge has a semicircular shape for the portion that extends past the lateral edge of the upper surface of the partition wall in the first direction D1 towards regions overlapping the light emitting layer 381 in the second direction D2. However, in other exemplary embodiments, this portion of the lateral edge may have a variety of different shapes.

In the embodiment shown in FIG. 3, the auxiliary layer 380 may provide lyophobicity not only to the upper surface of the partition wall 360 but also to an upper end of the lateral surface of the partition wall 360. Therefore, when the light emitting solution is injected into the opening 365, sufficient lyophobicity by the auxiliary layer 380 may be provided, particularly in a region corresponding to an entrance of the opening 365, to prevent the light emitting solution from overflowing the partition wall.

According to the auxiliary layer 380 having this shape, the light emitting solution provided in the manufacturing process may be more effectively provided inside the opening 365 and the light emitting layer 370 may be more stably formed.

Referring to the exemplary embodiment shown in FIG. 4, the auxiliary layer 380 may include a plurality of nanoparticles 383. For example, the nanoparticles 383 may include silica nanoparticles or the like. However, exemplary embodiments of the present inventive concepts are not limited thereto and may include any nanoparticle having a diameter of a nano unit.

The nanoparticles 383 according to an exemplary embodiment may also include fluorine bonded to a surface of the nanoparticles 383. The nanoparticles 383 including the fluorine bonded to the surface thereof may provide the auxiliary layer 380 with a low surface energy. Therefore, the auxiliary layer 380 may exhibit a high lyophobicity.

A surface 380s of the auxiliary layer 380 including the nanoparticles 383 may have protrusions and depressions. The surface 380s of the auxiliary layer 380 may be a surface having a predetermined roughness. For example, the surface 380s of the auxiliary layer 380 including the nanoparticles 383 may have a greater roughness than the auxiliary layer 380 shown in the embodiments of FIG. 1 to FIG. 3. The auxiliary layer 380 according to the exemplary embodiment of FIG. 4 may provide lyophobicity through the nanoparticles 383 that provide a predetermined roughness even if the auxiliary layer does not include a separate lyophobic agent (e.g., a material having a lyophobic composition).

The auxiliary layer 380 including the plurality of nanoparticles 383 may be excellent in plasma resistance and the like. For example, even if a plasma treatment according to a residual film removing process (described later) is performed on the surface of the auxiliary layer 380, the auxiliary layer 380 may not incur significant damage.

The maximum thickness t2 of the auxiliary layer 380 may be from about 30 nm to about 200 nm. The thickness of the auxiliary layer 380 may be set by the content of the nanoparticles 383. In an exemplary embodiment, the thickness of the auxiliary layer 380 may be considerably thinner than that of the partition wall 360 having a thickness of about 1 μm to about 1.5 μm.

In embodiments in which the maximum thickness of the auxiliary layer 380 is less than about 30 nm, it may be difficult to provide physical lyophobicity to the upper portion of the auxiliary layer 380. This is because the nanoparticles 383 for providing the physical lyophobicity are not sufficiently included in the auxiliary layer 380. The thickness of the auxiliary layer 380 may not exceed 200 nm so that the auxiliary layer 380 has sufficient lyophobicity and the light emitting solution is stably positioned on the opening 365. When the thickness of the auxiliary layer 380 exceeds 200 nm, the light emitting solution injected into the opening 365 may be excessively swollen, and the light emitting solution may flow in an adjacent opening and may not be stably positioned in the opening.

The auxiliary layer 380 including the nanoparticles 383 may have surface energy of 20 dyne/cm or less. The partition wall 360 may have surface energy of about 30 dyne/cm to about 43 dyne/cm, the light emitting solution forming the light emitting layer 370 may have surface energy of about 17 dyne/cm to 35 dyne/cm, and the pixel electrode 191 may have surface energy of 40 dyne/cm. The surface energy of the partition wall 360 may be greater than those of the light emitting solution forming the light emitting layer 370 and the auxiliary layer 380, and may be smaller than that of the pixel electrode 191.

Hereinafter, a manufacturing method of the display device according to the exemplary embodiments of FIGS. 5-9 will be described. FIGS. 5, 6, 7, 8, and 9 illustrate cross-sectional views of a display device manufactured by using a manufacturing method according to an exemplary embodiment.

First, the transistor including the buffer layer 111, the semiconductor layer 130, the gate electrode 124, the source electrode 153, and the drain electrode 155, the first insulating film 141, the second insulating film 142, and the third insulating film 160 are formed on the substrate 110. The pixel electrode 191 connected to the drain electrode 155 is formed on the third insulating film 160.

Figure 5:
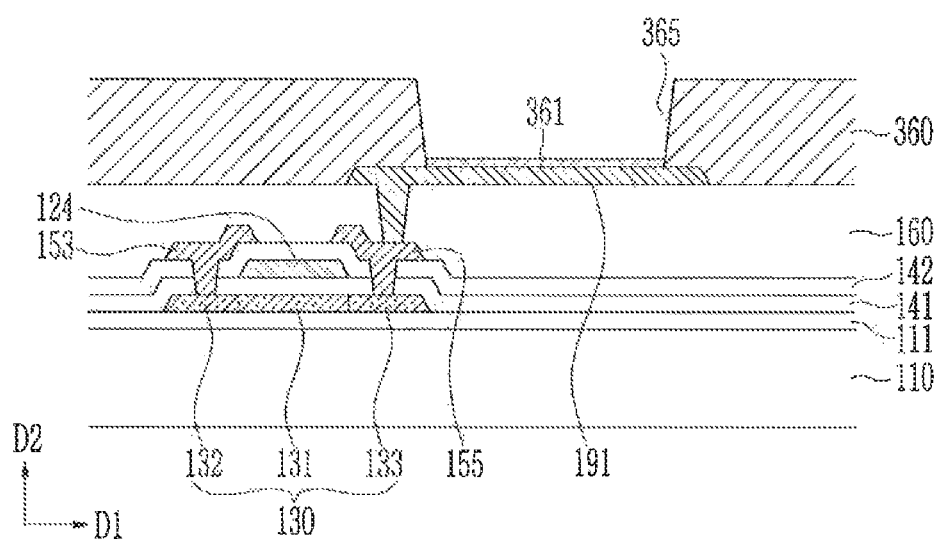
FIGS. 5, 6, 7, 8, and 9 illustrate cross-sectional views of a display device manufactured by using a manufacturing method according to exemplary embodiments of the present inventive concepts.

Next, as shown in FIG. 5, the third insulating film 160 and the partition wall 360 having the opening 365 in the pixel electrode 191 are formed. The opening 365 may expose a portion of the pixel electrode 191.

The partition wall 360 may be formed by patterning a first material layer. The partition wall 360 including the opening 365 may be formed through a photolithography process.

The first material layer may overlap a front surface of the substrate 110, and may include, for example, an organic material such as benzocyclobutene, a polyamide resin, a polyacrylic resin, a polyimide resin, and a phenol resin, or a siloxane-based inorganic material.

When the photolithography process is performed to form the opening 365, a residual film 361 is formed on the pixel electrode 191 by the first layer material forming the partition wall 360. For example, a thickness of the residual film 361 (e.g., a length from an upper surface of the residual film to a lower surface of the residual film in the second direction D2) may be about 10 nm to about 20 nm. In embodiments in which the residual film 361 is not removed, since the residual film 361 is disposed between the light emitting layer 370 and the pixel electrode 191, the light emitting efficiency and the light emitting lifetime of the light emitting device may be lowered.

Figure 6:
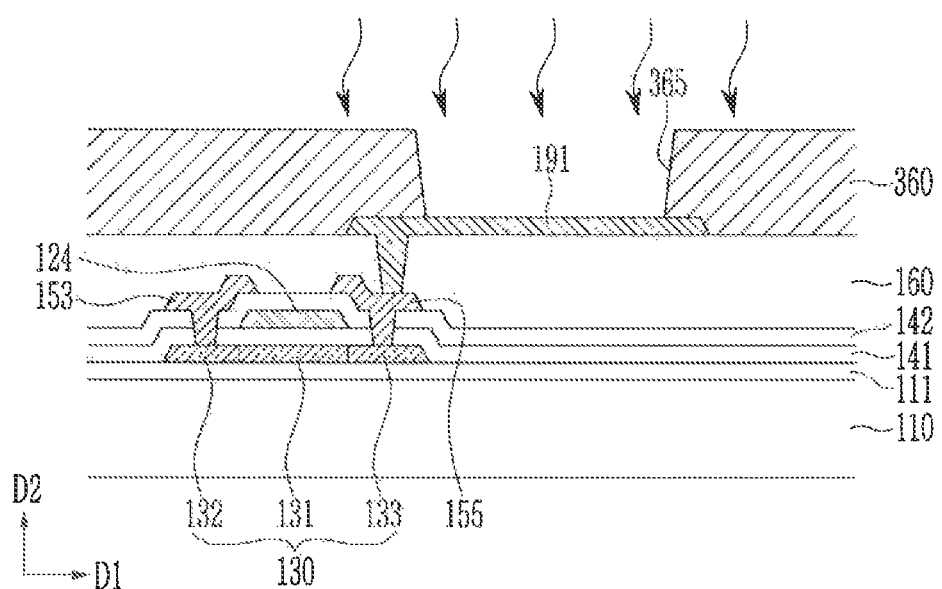

As shown in FIG. 6, the residual film 361 described in FIG. 5 may be removed through a residual film removing process. For example, a plasma process or a $UVO_3$ process may be used to remove the residual film 361. However, exemplary embodiments are not limited thereto and any method for removing the residual film may be performed.

Since the residual film removing process is performed on the front surface of the substrate 110, a portion of a surface of the partition wall 360 exposed on the substrate 110 may be damaged when removing the residual film.

Figure 7:
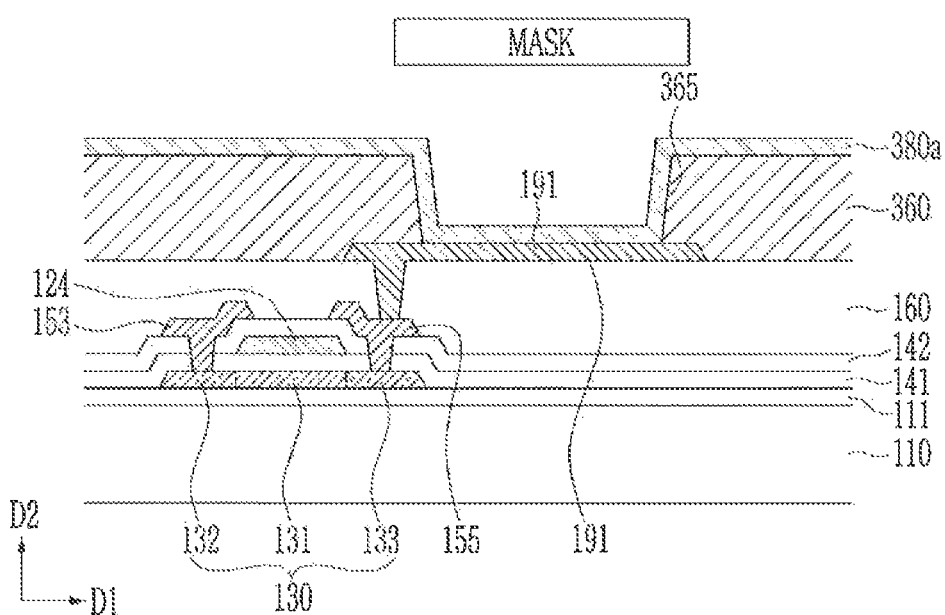

After the residual film removing process is performed, as shown in FIG. 7, a second material layer 380a is applied so as to overlap the front surface of the substrate 110. For example, as shown in FIG. 7, the second material layer 380a may be disposed on upper surfaces and lateral edges of the partition wall 360 and the exposed surface of the pixel electrode 191.

The second material layer 380a may include a compound and a resin that provide lyophobicity.

The compound with lyophobicity may be in a form of a polymer or a monomer. For example, the compound may include at least one of a fluorine-based compound and a siloxane-based compound. The fluorine-based compound may include, for example, a compound represented by Chemical Formula 1. The siloxane-based compound may include, for example, a compound represented by Chemical Formula 2. The resin may include, for example, a compound represented by Chemical Formula 3.

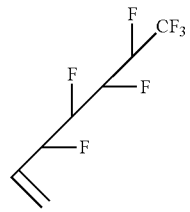

(Chemical Formula 1)

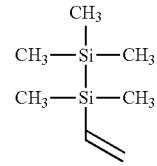

(Chemical Formula 2)

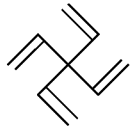

(Chemical Formula 3)

A molecular weight of the monomer or polymer included in the second material layer 380a may be smaller than the molecular weight of the first material layer included in the partition wall 360. In addition, the compound having lyophobicity included in the second material layer 380a may be included in an amount of about 5 wt % or less with respect to a total content of the second material layer 380a.

A mask (MASK) is disposed on the second material layer 380a, and a region not overlapping the mask (MASK) is cured. An uncured area may be subsequently removed by using a solvent.

In an exemplary embodiment, the same solvent as that included in the second material layer 380a may be used for removing the uncured second material layer. However, in exemplary embodiments, the solvent may include any solvent for removing the uncured second material layer 380a. The solvent may be an organic solvent. For example, the solvent may be at least one of toluene, cyclopentanone, anisole, and propylene glycol methyl ether acetate (PG-MEA). However, exemplary embodiments of the present inventive concepts are not limited thereto.

Figure 8:
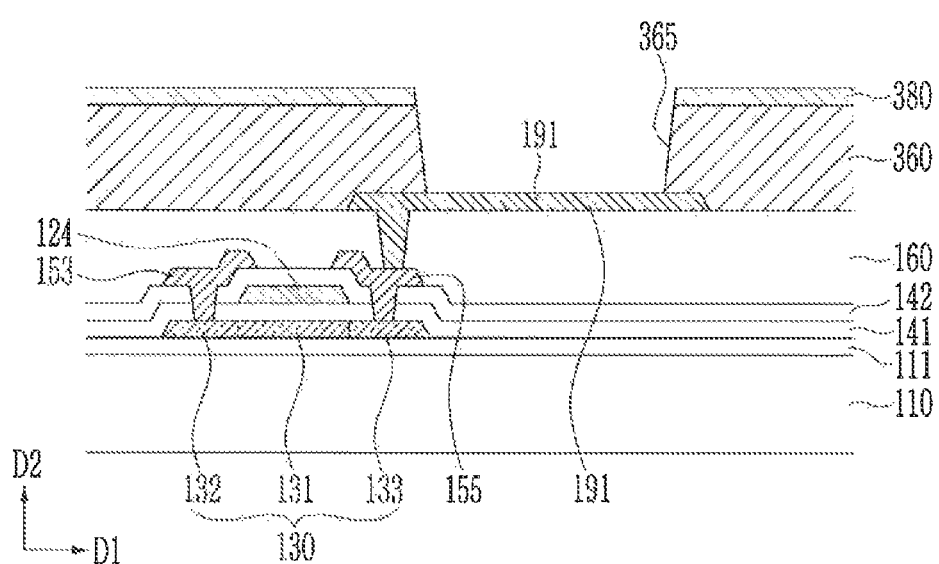

As shown in FIG. 8, the auxiliary layer 380 is then formed on the partition wall 360 and is not formed within the opening 365. Although the exemplary embodiment of FIG. 8 shows the auxiliary layer 380 as having an inclined lateral edge that is substantially aligned with the inclined lateral edge of the partition wall 360, the auxiliary layer 380 may also be formed to have the shapes shown in the exemplary embodiments of FIG. 2 and FIG. 3 depending on the shape or alignment of the mask.

Figure 9:
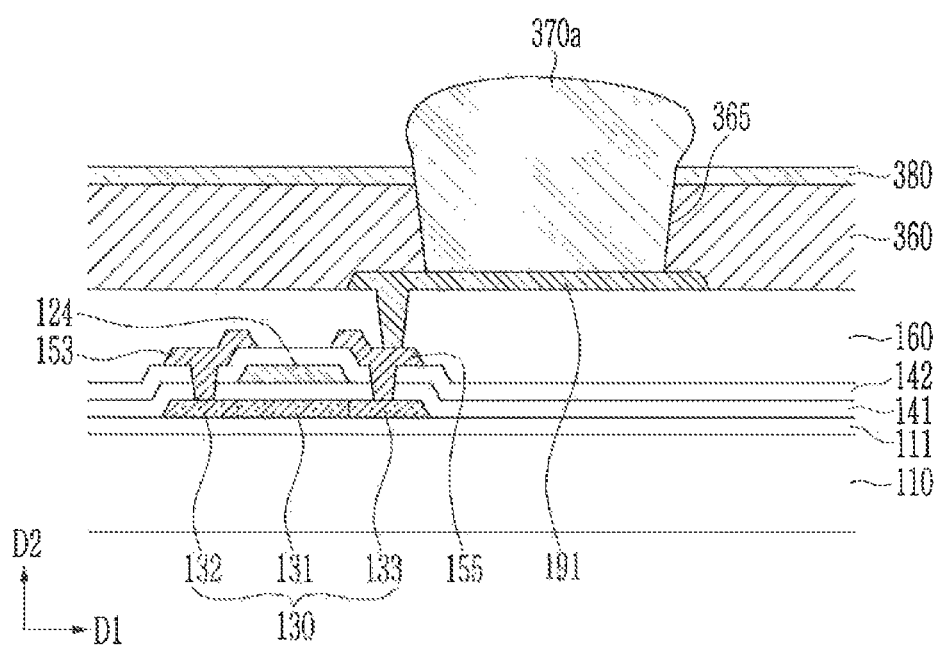

As shown in FIG. 9, a light emitting solution 370a for forming the light emitting layer on the opening 365 is subsequently provided. The light emitting solution 370a may be provided through a solution process, and for example, may be provided using inkjet printing.

In the display device according to an exemplary embodiment of the present inventive concepts, since the lyophobic auxiliary layer 380 is formed at the upper end (e.g., in the second direction D2) of the partition wall 360, the light emitting solution 370a provided by the solution process may be stably positioned within the opening 365 of the partition wall 360 without overflowing the auxiliary layer 380.

The solvent included in the light emitting solution 370a is removed through a drying process or the like and the light emitting layer 370 as shown in FIG. 1 may be formed. Thereafter, the common electrode 270 and the encapsulation layer 400 may be sequentially formed on the light emitting layer 370 to provide the display device as shown in FIG. 1.

When the residual film removing process is performed after the auxiliary layer is formed, not only the residual film disposed on the pixel electrode but also the auxiliary layer disposed on the upper portion of the partition wall may be damaged. Therefore, the lyophobicity of the auxiliary layer may be lowered, and the light emitting solution provided for forming the light emitting layer may also overflow from the opening 365 to be positioned on the upper surface of the partition wall.

However, in the display device according to an exemplary embodiment of the present inventive concepts, the auxiliary layer having lyophobicity is formed after the residual film removing process is performed. Therefore, the auxiliary layer may stably provide lyophobicity to the upper surface of the partition wall to stably form the light emitting layer as well as to effectively remove the residual film that lowers the light emitting efficiency and the light emitting lifetime. Accordingly, it is possible to provide a display device having improved reliability.

Figure 10:
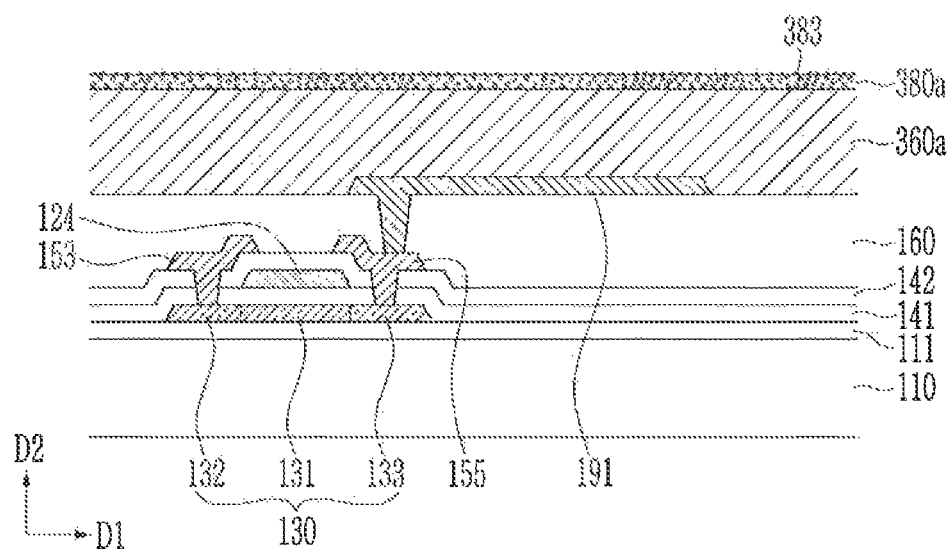
FIGS. 10, 11, and 12 illustrate a schematic cross-sectional view of a display device manufactured by using a manufacturing method according to exemplary embodiments of the present inventive concepts.
Figure 11:
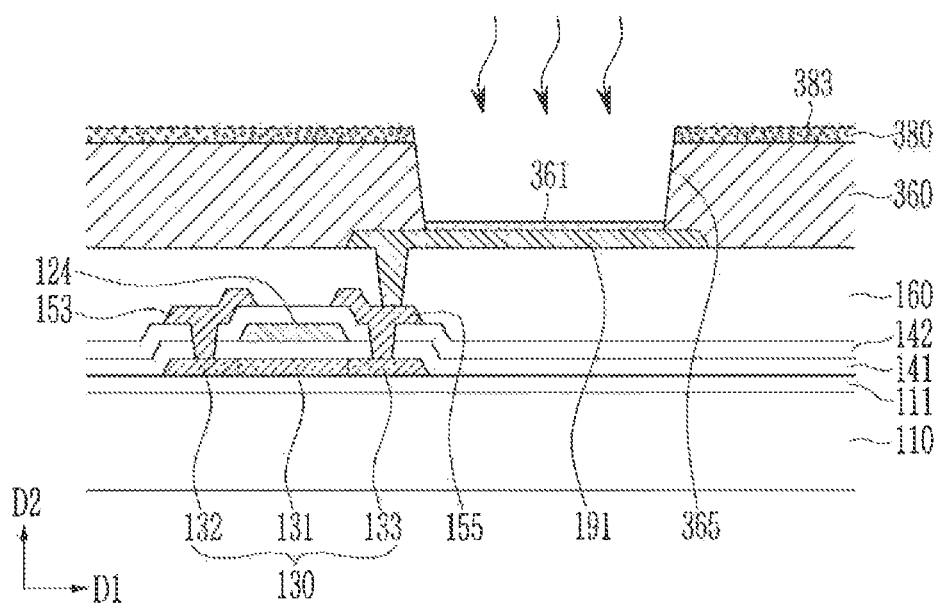
Figure 12:
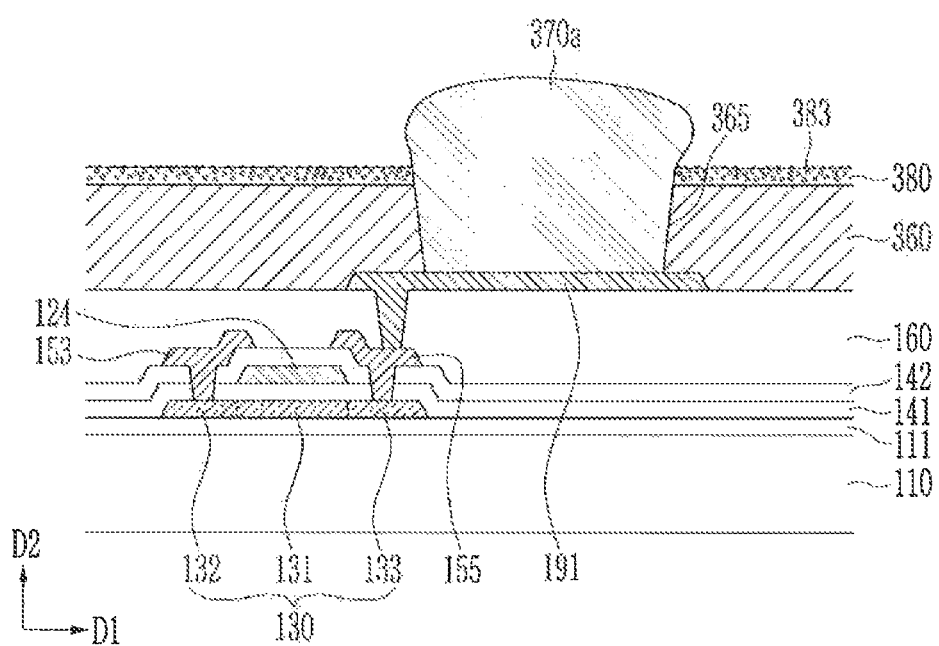

Hereinafter, a manufacturing method of the display device according to an exemplary embodiment will be described with reference to FIG. 10 to FIG. 12. FIGS. 10, 11, and 12 illustrate a cross-sectional view of a display device manufactured by using a manufacturing method according to exemplary embodiments.

First, the transistor including the buffer layer 111, the semiconductor layer 130, the gate electrode 124, the source electrode 153, and the drain electrode 155, the first insulating film 141, the second insulating film 142, and the third insulating film 160, are formed on the substrate 110. The pixel electrode 191 connected to the drain electrode 155 is formed on the third insulating film 160.

Next, as shown in FIG. 10, a first material layer 360a and the second material layer 380a overlapping the front surface of the substrate 110 are respectively formed on the third insulating film 160 and the pixel electrode 191.

For example, the first material layer 360a may include an organic material such as benzocyclobutene, a polyamide resin, a polyacrylic resin, a polyimide resin, a phenol resin, or a siloxane-based inorganic material.

The second material layer 380a may include the plurality of nanoparticles 383. The second material layer 380a according to the exemplary embodiment may not include a compound having lyophobicity, but is not limited thereto, and it may partially include a compound having lyophobicity.

An upper surface of the second material layer 380a may be provided with protrusions and depressions. The protrusions and depressions may be formed by the plurality of nanoparticles 383.

As shown in FIG. 11, the partition wall 360 including the opening 365 and the auxiliary layer 380 are subsequently formed. The partition wall 360 and the auxiliary layer 380 may be manufactured through a photolithographic process.

In the above process, the residual film 361 generated while the first material layer is removed is formed on the exposed portion of the pixel electrode 191.

The residual film 361 is a factor that degrades the light emitting efficiency and the light emitting lifetime of the light emitting element. The residual film 361 may be removed through a residual film removing process. For example, the residual film removing process may be a plasma process or a $UVO_3$ process. However, exemplary embodiments of the present inventive concepts are not limited thereto.

In this embodiment, since the auxiliary layer 380 has excellent resistance to a plasma or $UVO_3$ process by the plurality of nanoparticles 383, the auxiliary layer exhibits little surface damage from the residual film removing process. The upper portion of the partition wall 360 may maintain lyophobicity by the auxiliary layer 380, and only the unnecessary residual film 361 may be removed by the residual film removing process.

As shown in FIG. 12, the light emitting solution 370a for forming the light emitting layer may subsequently be injected onto the opening 365. The light emitting solution 370a may be provided through the solution process, and for example, may be provided through an inkjet process.

According to an exemplary embodiment, in the process in which the light emitting solution 370a is provided, the auxiliary layer 380 provided with the protrusions and depressions formed by the plurality of nanoparticles 383 is disposed at the upper surface of the partition wall 360. Since the protrusions and depressions of the auxiliary layer 380 provides lyophobicity, the light emitting solution 370a may be stably injected into the opening 365 without remaining at the upper end of the auxiliary layer 380. The light emitting solution 370a may be injected into the opening 365 without overflowing the upper portion of the partition wall 360.

While the solvent of the light emitting solution 370a is removed through a drying process or the like, the light emitting layer 370 as shown in FIG. 4 may be formed. Thereafter, the common electrode 270 and the encapsulation layer 400 may be sequentially formed on the light emitting layer 370 to provide the display device as shown in FIG. 4.

Although it is illustrated that the auxiliary layer 380 including the plurality of nanoparticles 383 according to the exemplary embodiment is formed before the residual film removing process, the present invention is not limited thereto, and the auxiliary layer 380 including the plurality of nanoparticles 383 may be formed subsequent to the residual film removing process as described for the exemplary embodiments of the manufacturing process of FIG. 5 to FIG. 9. The auxiliary layer 380 including the plurality of nanoparticles 383 is resistant to damage caused by the residual film removing process. Therefore, the auxiliary layer 380 including the plurality of nanoparticles 383 may be formed before or after the residual film removing process.

Figure 13:
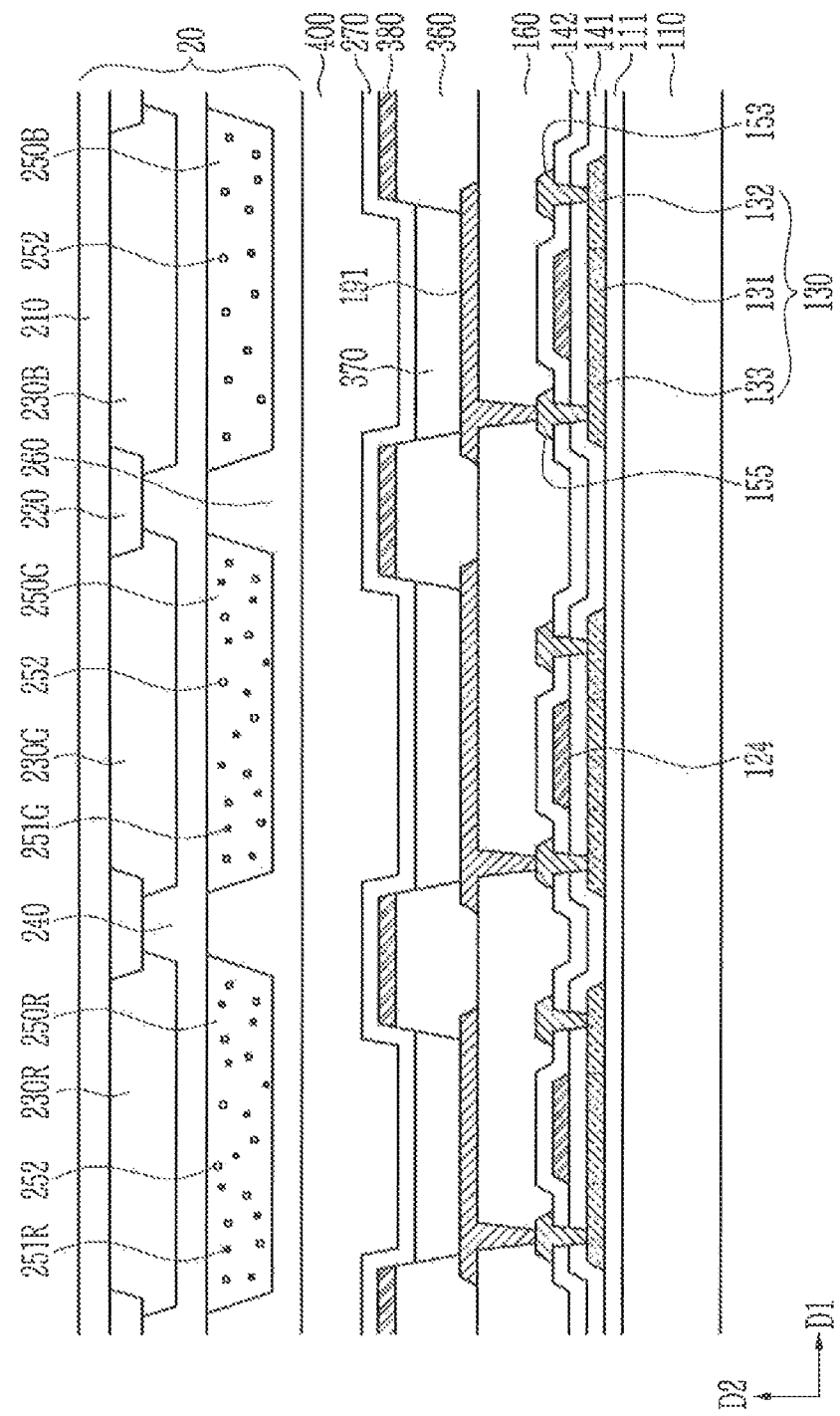
FIG. 13 illustrates a schematic cross-sectional view of a display device according to an exemplary embodiment of the present inventive concepts.

Hereinafter, a display device according to an exemplary embodiment of the present inventive concepts will be described with reference to FIG. 13. FIG. 13 illustrates a cross-sectional view of a display device according to an exemplary embodiment. The display device according to the exemplary embodiment of FIG. 13 includes the substrate 110, the buffer layer 111, the semiconductor layer 130, the first insulating film 141, the gate electrode 124, the second insulating film 142, the source electrode 153, the drain electrode 155, the third insulating film 160, the pixel electrode 191, the partition wall 360, the auxiliary layer 380, the light emitting layer 370, the common electrode 270, and the encapsulation layer 400, as previously described and a detailed description thereof will be omitted. The light emitting layer 370 may emit blue light.

Hereinafter, a color converting panel 20 disposed on the encapsulation layer 400 will be described in detail.

The color converting panel 20 includes a second substrate 210 overlapping (e.g., in the second direction D2) the first substrate 110. A red color filter 230R, a green color filter 230G, and a blue color filter 230B arranged in a first direction D1 may be disposed on the second substrate 210.

The display device according to the exemplary embodiment is provided with at least one light blocking member 220 surrounding the red color filter 230R, the green color filter 230G, and the blue color filter 230B. For example, the red color filter 230R, green color filter 230G and the blue color filter 230B may be spaced apart in the first direction D1 and the light blocking member 220 may fill the spaces therebetween. The light blocking member 220 may prevent different light emitted from adjacent pixels from mixing with each other and may partition the area in which the red color filter 230R, the green color filter 230G, and the blue color filter 230B are disposed.

A first flat film 240 is disposed between the light blocking members 220, the red color filter 230R, the green color filter 230G, and the blue color filter 230B, and the encapsulation layer 400. For example, as shown in FIG. 13, the first flat film 240 may be disposed directly below a lower surface (e.g., in the second direction D2) of the light blocking members 220, the red color filter 230R, the green color filter 230G, and the blue color filter 230B. The first flat film 240 may be a film for flattening (e.g., planarizing) a surface of the light blocking member 220, the red color filter 230R, the green color filter 230G, and the blue color filter 230B. For example, the first flat film 240 may flatten the lower surface (e.g., in the second direction D2) of the light blocking member 220, the red color filter 230R, the green color filter 230G, and the blue color filter 230B. The first flat film 240 may include at least one of an organic insulating material and an inorganic insulating material.

The red color converting layer 250R, the green color converting layer 250G, and the transmissive layer 250B may be disposed between the first flat film 240 and the encapsulation layer 400. For example, the red color converting layer 250R, the green color converting layer 250G, and the transmissive layer 250B may be disposed directly below a lower surface (e.g., in the second direction D2) of the first flat film 240. The red color conversion layer 250R, the green color conversion layer 250G, and the transmissive layer 250B may be repeatedly arranged along the first direction D1 and may be spaced apart from each other. For example, as shown in FIG. 13, spaces between the color conversion layers may overlap (e.g., in the second direction D2) with the light blocking members 220.

The red color conversion layer 250R and the green color conversion layer 250G convert light emitted from the light emitting layer 370 and emit the light. For example, the red color conversion layer 250R may convert blue light emitted from the light emitting layer 370 into red light. The red color conversion layer 250R may include a first semiconductor nanocrystal 251R that converts blue light incident from the light emitting layer 370 into red light. The first semiconductor nanocrystal 251R may include at least one of a phosphor and a quantum dot.

The green color conversion layer 250G may convert blue light emitted from the light emitting layer 370 into green light. The green color conversion layer 250G may include a second semiconductor nanocrystal 251G that converts blue light incident from the light emitting layer 370 into green light. The second semiconductor nanocrystal 251G may include at least one of a phosphor and a quantum dot.

The transmissive layer 250B emits incident light from the light emitting layer 370 without conversion of the incident light. For example, blue light may be incident on the transmissive layer 250B and may be emitted as it is without conversion by the transmissive layer.

The quantum dot included in the first semiconductor nanocrystal 251R and the second semiconductor nanocrystal 251G may be independently selected from a Group II-VI compound, a Group III-V compound, a Group IV-VI compound, a Group IV element, a Group IV compound, and a combination thereof. The specific compounds are the same as those described above with respect to the quantum dot of the light emitting layer 370.

The transmissive layer 250B may transmit incident light as it is. The transmissive layer 250B may include a resin that transmits blue light. The transmissive layer 250B disposed in a region that emits blue light does not include any separate semiconductor nanocrystal.

Although not shown, the transmissive layer 250B may further include at least one of a dye and a pigment. The transmissive layer 250B including the dye or pigment may reduce the external light reflection, and may provide the blue light with improved color purity.

At least one of the red color conversion layer 250R, the green color conversion layer 250G, and the transmissive layer 250B may further include scatterers 252. The contents of the respective scatterers 252 included in the red color conversion layer 250R, the green color conversion layer 250G and the transmissive layer 250B may be different. The scatterers 252 may increase an amount of light that is converted in or passes through the color conversion layers 250R and 250G and the transmissive layer 250B and then is emitted through the color conversion layers and the transmissive layer. The scatterers 252 may uniformly provide front luminance and lateral luminance for the light emitted from the light emitting layer 370.

The scatterers 252 may include any material capable of evenly scattering incident light. In an exemplary embodiment, the scatterers 332 may include at least one among TiO2, ZrO2, Al2O3, In2O3, ZnO, SnO2, Sb2O3, and ITO.

As one example, the red color conversion layer 250R, the green color conversion layer 250G, and the transmissive layer 250B may include a photosensitive resin, and may be formed through a photolithography process. However, exemplary embodiments of the present inventive concepts are not limited thereto. For example, the red color conversion layer 250R, the green color conversion layer 250G, and the transmissive layer 250B may be formed through a printing process or an inkjet process, and the red color conversion layer, the green color conversion layer and the transmissive layer may include a material that is not the photosensitive resin. In the present specification, although it is described that the color conversion layer and the transmissive layer are formed through the photolithography process, the printing process, or the inkjet process, exemplary embodiments of the present inventive concepts are not limited thereto.

The red color conversion layer 250R may overlap the red color filter 230R in the second direction D2, the green color conversion layer 250G may overlap the green color filter 230G in the second direction D2, and the transmissive layer 250B may overlap the blue color filter 230B in the second direction D2.

A second flat film 260 is disposed in lateral spaces between the red color conversion layer 250R, the green color conversion layer 250G and the transmissive layer 250B and between lower surfaces of the color conversion layers and an upper surface of the encapsulation layer 400. The second flat film 260 may overlap a front surface of the second substrate 210.

The second flat film 260 may flatten (e.g., planarize) one surface of the red color conversion layer 250R, the green color conversion layer 250G, and the transmissive layer 250B. The second flat film 260 may include an organic insulating material or an inorganic insulating material. However, exemplary embodiments of the present inventive concepts are not limited thereto and the second flat film 260 may include any material capable of performing a flattening function.

In the exemplary embodiment of FIG. 13, the encapsulation layer 400 and the color converting panel 20 are in direct contact with each other. However, exemplary embodiments of the present inventive concepts are not limited thereto. For example, in some exemplary embodiments, a separate filling layer may be disposed between the encapsulation layer 400 and the color converting panel 20. In this embodiment, the encapsulation layer 400 and the color converting panel 20 may be combined through various known methods and structures, such as by a separate adhesive layer or by a sealant along an edge of the display device. In addition, the present specification may include a filter layer positioned between the color conversion layers 250R and 250G and the encapsulation layer 400 to emit light of a specific wavelength, or may include a second substrate 210 and the color conversion layers 250R and 250G, and a blue light blocking filter positioned between the second substrate and the transmissive layer 250B.

While this invention has been described in connection with exemplary embodiments, it is to be understood that the invention is not limited to the disclosed embodiments, but, on the contrary, is intended to cover various modifications and equivalent arrangements included within the spirit and scope of the appended claims.

What is claimed is:

1. A manufacturing method of a display device, comprising:
    forming a thin film transistor and a pixel electrode connected to the thin film transistor on a substrate;
    forming a first material layer overlapping the pixel electrode on the substrate;
    etching the first material layer o form a partition wall including an opening, wherein a residual film of the first material layer is on the pixel electrode after the etching is performed;
    removing the residual film on the pixel electrode; and
    forming an auxiliary layer having lyophobicity on the partition wall.

2. The manufacturing method of the display device of claim 1, wherein the removing of the residual film includes the performing of at least one of a plasma process and a $UVO_3$ process.

3. The manufacturing method of the display device of claim 1, wherein
    the forming of the auxiliary layer includes:
    forming a second material layer on the partition wall;
    removing an uncured area in the second material layer using an organic solvent.

4. The manufacturing method of the display device of claim 3, wherein the organic solvent includes at least one of toluene, cyclopentanone, anisole, and propylene glycol methyl ether acetate (PGMEA).

5. The manufacturing method of the display device of claim 3, wherein the second material layer includes the same solvent as the organic solvent.

6. The manufacturing method of the display device of claim 1, further comprising:
    providing a light emitting solution in the opening; and
    drying the light emitting solution to form a light emitting layer.

7. The manufacturing method of claim 1, wherein the forming of the auxiliary layer is performed after h removing of the residual film.

8. The manufacturing method of claim 1, wherein a thickness of the auxiliary layer is less than a thickness of the partition wall.

9. The manufacturing method of claim 8, wherein:
    the thickness of the auxiliary layer is in a range of about 100 nm to about 200 nm; and
    the thickness of the partition wall is in a range of about 1 µm to about 1.5 µm.

10. A manufacturing method of a display device, comprising:
    forming a thin film transistor and a pixel electrode connected to the thin film transistor on a substrate;
    sequentially forming a first material layer and a second material layer overlapping the substrate on the pixel electrode;
    etching the first material layer and the second material layer to form a partition wall having an opening and an auxiliary layer; and
    removing a residual film formed on the pixel electrode, wherein the second material layer includes a plurality of nanoparticles.

11. The manufacturing method of the display device of claim 10, wherein the plurality of nanoparticles include silica nanoparticles.

12. The manufacturing method of the display device of claim 10, wherein a surface of the auxiliary layer includes protrusions and depressions.

* * * * *